US006821571B2

(12) United States Patent
Huang (10) Patent No.: US 6,821,571 B2
(45) Date of Patent: Nov. 23, 2004

(54) PLASMA TREATMENT TO ENHANCE ADHESION AND TO MINIMIZE OXIDATION OF CARBON-CONTAINING LAYERS

(75) Inventor: Judy Huang, Los Gatos, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/336,525

(22) Filed: Jun. 18, 1999

(65) Prior Publication Data

US 2002/0054962 A1 May 9, 2002

(51) Int. Cl.[7] .......................... C23C 14/02; C23C 14/08; C23C 14/58; H01L 21/3105; H01L 21/314
(52) U.S. Cl. .................. 427/535; 427/569; 427/249.15; 427/534; 438/761; 438/763; 438/786; 438/787
(58) Field of Search ................................. 427/534, 535, 427/536, 539, 569, 249.15, 488, 489, 490, 491, 563, 577, 579, 527; 438/761, 763, 780, 787, 788, 789, 798

(56) References Cited

U.S. PATENT DOCUMENTS

| 4,262,631 | A | | 4/1981 | Kubacki | 118/723 |
|---|---|---|---|---|---|
| 4,289,798 | A | * | 9/1981 | Bagley et al. | 427/536 |
| 4,361,638 | A | * | 11/1982 | Higashi et al. | 427/535 |
| 4,420,386 | A | | 12/1983 | White | 204/192 |

(List continued on next page.)

FOREIGN PATENT DOCUMENTS

| DE | 39 07 857 C1 | 5/1990 | ........... C23C/16/32 |
|---|---|---|---|
| DE | 19654737 A1 | 7/1997 | |
| EP | 0 194 652 | 9/1986 | ........... C23C/14/06 |
| EP | 0 630 989 A2 | 6/1994 | ........... C23C/16/44 |
| EP | 0 785 475 A2 | 7/1997 | ........... G03G/5/082 |
| GB | 2 155 862 A | 10/1985 | ........... C23C/16/44 |
| JP | 62-158859 | 7/1987 | ........... C23C/14/02 |

OTHER PUBLICATIONS

U.S. patent application No. 09/657,392 filed on Sep. 8, 2000 (AMAT/4479.Y1).

Youngsoo Park., et al., Institute of Electrical Engineers, "Endothermic reactions between mullite and silicon carbide in an argon plasma environment;" Journal of American Ceramic Society, USA, Jan., 1988, American Ceramic Soc., USA, vol. 81, No. 1, XP–002201865, abstract only supplied.

Tremblay, Marc, et al., "Hexagonal Sensor with Imbeddes Analog Image Processing for Pattern Recognition," IEEE 1993 Custom Integrated Circuits Conference, May 9, 1993, pp. 12701–12704, XP–000409694.

Primary Examiner—Marianne Padgett
(74) Attorney, Agent, or Firm—Moser Patterson & Sheridan (57) ABSTRACT

The present invention generally provides improved adhesion and oxidation resistance of carbon-containing layers without the need for an additional deposited layer. In one aspect, the invention treats an exposed surface of carbon-containing material, such as silicon carbide, with an inert gas plasma, such as a helium (He), argon (Ar), or other inert gas plasma, or an oxygen-containing plasma such as a nitrous oxide ($N_2O$) plasma. Other carbon-containing materials can include organic polymeric materials, amorphous carbon, amorphous fluorocarbon, carbon containing oxides, and other carbon-containing materials. The plasma treatment is preferably performed in situ following the deposition of the layer to be treated. Preferably, the processing chamber in which in situ deposition and plasma treatment occurs is configured to deliver the same or similar precursors for the carbon-containing layer(s). However, the layer(s) can be deposited with different precursors. The invention also provides processing regimes that generate the treatment plasma and systems which use the treatment plasma. The carbon-containing material can be used in a variety of layers, such as barrier layers, etch stops, ARCs, passivation layers, and dielectric layers.

7 Claims, 3 Drawing Sheets

U.S. PATENT DOCUMENTS

| | | | | |
|---|---|---|---|---|
| 4,510,178 | A | | 4/1985 | Paulson et al. ............... 427/94 |
| 4,532,150 | A | | 7/1985 | Endo et al. .................... 427/39 |
| 4,634,496 | A | * | 1/1987 | Mase et al. |
| 4,634,601 | A | | 1/1987 | Hamakawa et al. .......... 427/39 |
| 4,759,947 | A | | 7/1988 | Ishihara et al. ............... 427/38 |
| 4,957,591 | A | * | 9/1990 | Sato et al. ................... 427/535 |
| 4,965,090 | A | * | 10/1990 | Gartner et al. .............. 427/534 |
| 4,980,196 | A | | 12/1990 | Yasuda et al. ................ 427/38 |
| 4,994,410 | A | | 2/1991 | Sun et al. .................... 437/192 |
| 5,000,113 | A | | 3/1991 | Wang et al. ................. 118/723 |
| 5,121,706 | A | | 6/1992 | Nichols et al. ............. 118/719 |
| 5,162,133 | A | * | 11/1992 | Bartha et al. ............... 427/577 |
| 5,232,871 | A | | 8/1993 | Ho ............................. 437/190 |
| 5,238,866 | A | | 8/1993 | Bolz et al. .................. 437/100 |
| 5,270,267 | A | * | 12/1993 | Ouellet ....................... 427/535 |
| 5,419,783 | A | * | 5/1995 | Noguchi et al. ............. 136/258 |
| 5,458,927 | A | * | 10/1995 | Malaczynski et al. ...... 427/535 |
| 5,465,680 | A | | 11/1995 | Loboda ......................... 117/84 |
| 5,487,922 | A | * | 1/1996 | Nieh et al. .................. 427/535 |
| 5,512,512 | A | | 4/1996 | Isobe .......................... 437/187 |
| 5,549,935 | A | * | 8/1996 | Nguyen et al. ............. 427/535 |
| 5,576,071 | A | * | 11/1996 | Sandhu ....................... 427/535 |
| 5,627,105 | A | | 5/1997 | Delfino et al. .............. 438/627 |
| 5,656,337 | A | * | 8/1997 | Park et al. ................... 427/535 |
| 5,660,682 | A | | 8/1997 | Zhao et al. .................. 438/715 |
| 5,726,097 | A | | 3/1998 | Yanagida .................... 438/622 |
| 5,780,163 | A | | 7/1998 | Camilletti et al. .......... 428/446 |
| 5,795,648 | A | * | 8/1998 | Goel et al. ...................... 1/578 |
| 5,801,098 | A | | 9/1998 | Fiordalice et al. .......... 438/653 |
| 5,818,071 | A | | 10/1998 | Loboda et al. |
| 5,821,603 | A | | 10/1998 | Puntambekar .............. 257/640 |
| 5,840,957 | A | * | 11/1998 | Kurian et al. ............... 427/535 |
| 5,869,147 | A | | 2/1999 | König ......................... 427/537 |
| 5,922,418 | A | * | 7/1999 | Koike et al. ................. 427/577 |
| 5,964,942 | A | * | 10/1999 | Tanabe et al. ............... 427/577 |
| 5,972,179 | A | * | 10/1999 | Chittipeddi et al. ........ 427/535 |
| 6,004,631 | A | * | 12/1999 | Mori ........................... 427/534 |
| 6,528,116 | B1 | * | 3/2003 | Pokharna et al. ...... 427/255.37 |
| 6,537,733 | B2 | | 3/2003 | Nemani et al. ............. 430/313 |
| 6,635,583 | B2 | * | 10/2003 | Bencher et al. ............. 437/761 |
| 2002/0016085 | A1 | | 2/2002 | Huang et al. ............... 438/798 |
| 2002/0054962 | A1 | | 5/2002 | Huang ........................ 427/533 |
| 2002/0182894 | A1 | | 12/2002 | Andideh ..................... 438/796 |

OTHER PUBLICATIONS

K. Mikagi, h. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film,". © 1996 IEEE,IEDM 96 365–368, pp. 14.5.1–14.5.4 1996—no month.

S. S. Wong, C. G. Sodini, T. W. Ekstedt, H.R. Grinolds, K. H. Jackson and Kwan, "Low PRessure Nitrided–Oxide as a Thin Gate Dielectric for MOSFET's," J. Electrochem Soc.: Solid–State Science and Technology, vol. 130, No. 5, May 1983, pp. 1139–1143.

Takahi Ito, Takao Nozaki, and Hajime Ishikawa, "Direct Thermal Nitridation of Silicon Dioxide Films in Anhydrous Ammonia Gas," Optical Properties, vol. 127, No. 9, Sep., 1980, pp. 2053–2057.

Richard Swope, Woo Sik Yoo, Julian Hsieh, Shari Shuchmann, Ferenc Nagy, Harald te Nijenhuis, and David Mordo, "Improvement of Adhesion Properties of Fluorinated Silica Glass Films by Nitrous Oxide Plasma Treatment," J. Electrochem. Soc., vol. 144, No. 7, Jul., 1997 © The Electrochemical Society, Inc., pp. 2559–2564.

S. Takeishi, H. Kudoh, R. Shinohara, A. Tsukune, Y. Sotoch, H. Miyazawa, H. Harada, and M. Yamada, "Stabilizing Dielectric Constants of Fluorine–Doped $SiO_2$ Films by $N_2O$–Plasma Annealing," J. Elelctrochem. Soc., vol. 143, No. 1, Jan., 1996 © The Electrochemical Society, Inc., pp. 381–385.

* cited by examiner

PLASMA TREATMENT TO ENHANCE ADHESION AND TO MINIMIZE OXIDATION OF CARBON-CONTAINING LAYERS

FIELD OF THE INVENTION

The present invention relates generally to the fabrication of integrated circuits on substrates. More particularly, the invention relates to a plasma treatment of carbon-containing layers, such as silicon carbide, to enhance adhesion to an adjacent layer and to minimize oxidation of the carbon-containing layer.

BACKGROUND OF THE INVENTION

Sub-quarter micron multi-level metallization is one of the key technologies for the next generation of ultra large scale integration (ULSI). Reliable formation of multilevel interconnect features is very important to the success of ULSI and to the continued effort to increase circuit density and quality on individual substrates and die. As circuit density has increased, materials and structural changes have occurred in the substrate stack. Some of the fundamental properties such as layer adhesion and oxidation resistance are needing revisiting as a result.

As layers are deposited in sequence, adhesion between layers becomes important to maintain structural integrity and to meet the performance demands of the devices being formed. The use of new low k materials, useful as barrier layers, etch stops, anti-reflective coatings (ARCs), passivation layers, and other layers must provide good adhesion to be integrated into the fabrication sequence. As an example, some of the new materials for ULSI use halogen doping, such as fluorine, to lower the k value of the layers, while maintaining desirable physical properties, such as strength. However, some of the doped material may outgas in processing. Thus, when adjacent layers are deposited and ultimately annealed, the layers may not properly adhere to each other, resulting in delamination of the layers.

Additionally, the new materials need to have improved oxidation resistance, particularly for layers exposed to an oxidizing plasma. As one example, layers require patterned etching and hence undergo a photolithography process in which a layer of photoresist material (typically organic polymers) is deposited on the layer to define the etch pattern. After etching, the photoresist layer is removed by exposing the photoresist layer to an active oxygen plasma, a process typically referred to as "ashing". During the rigorous plasma-enhanced oxidation of the ashing process, the charged particles of the plasma collide with the substrate which can cause film loss and/or distort the crystal lattice of the substrate, thereby comprising the integrity of the devices formed on the substrate. Erosion or film loss can lead to short circuiting between the reduced dimension features such as contacts, vias, lines, and trenches. The oxidation from ashing appears to especially affect carbon-containing materials, such as SiC, and, thus, such materials in general could also benefit from improved adhesion and increased oxidation resistance. Thus, an improved oxidation resistance and film. loss resistance to such rigorous environments is needed to maintain circuit integrity of the reduced dimension features.

Therefore, there is a need for improved processing that increases the resistance to oxidation and adhesion of carbon-containing materials.

SUMMARY OF THE INVENTION

The present invention generally provides improved adhesion and oxidation resistance of carbon-containing layers without the need for an additional deposited layer. In one aspect, the invention treats an exposed surface of carbon-containing material, such as SiC, with an inert gas plasma, such as a helium (He), argon (Ar), or other inert gas plasma, or an oxygen-containing plasma such as a nitrous oxide ($N_2O$) plasma. Other carbon-containing materials can include organic polymeric materials, $\alpha C$, $\alpha FC$, SiCO:H, and other carbon-containing materials. The plasma treatment is preferably performed in situ following the deposition of the layer to be treated. Preferably, the processing chamber in which in situ deposition and plasma treatment occurs is configured to deliver the same or similar precursors for the carbon-containing layer(s). However, the layer(s) can be deposited with different precursors. The invention also provides processing regimes that generate the treatment plasma and systems which use the treatment plasma. The carbon-containing material can be used in a variety of layers, such as barrier layers, etch stops, ARCs, passivation layers, and dielectric layers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The present invention provides improved adhesion and oxidation resistance of a carbon-containing layer by exposing the layer to an inert gas plasma or an oxygen-containing plasma without the need for an additional deposited layer.

Figure 1:
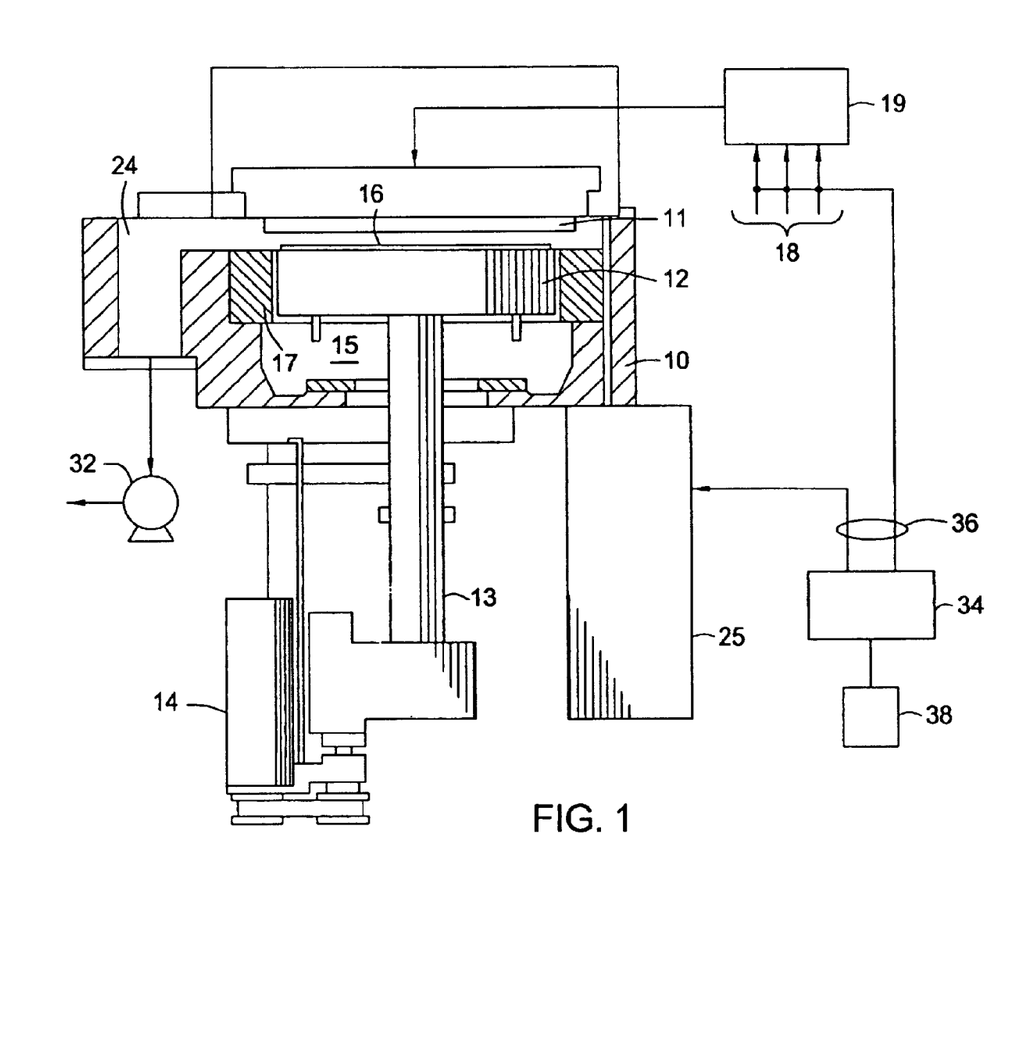
FIG. 1 is a cross-sectional schematic of one commercially available CVD plasma process chamber in which the plasma process of the present invention may be performed.

FIG. 1 is a cross-sectional schematic of a chemical vapor deposition (CVD) chamber, such as a CENTURA® DxZ™ CVD chamber available from Applied Materials, Inc. of Santa Clara, Calif., in which a plasma treatment process of the invention can be performed. The invention can be carried out in other process chambers, including a lamp heated process chamber. Process chamber 10 contains a gas distribution manifold 11, typically referred to as a "showerhead", for dispersing process gases through perforated holes (not shown) in the manifold to a substrate 16 that rests on a substrate support 12. Substrate support 12 is resistivily heated and is mounted on a support stem 13, so that substrate support and the substrate supported on the upper surface of substrate support can be controllably moved by a lift motor 14 between a lower loading/off-loading position and an upper processing position adjacent to the manifold 11. When substrate support 12 and the substrate 16 are in the processing position, they are surrounded by an insulator ring 17.

During processing, gases inlet to manifold 11 are uniformly distributed radially across the substrate surface. The gases are exhausted through a port 24 by a vacuum pump system 32. A controlled plasma is formed adjacent to the substrate by application of RF energy to distribution manifold 11 from RF power supply 25. The substrate support 12 and chamber walls are typically grounded. The RF power supply 25 can supply either single or mixed-frequency RF power to manifold 11 to enhance the decomposition of any gases introduced into the chamber 10. A controller 34 controls the functions of the power supplies, lift motors, mass controllers for gas injection, vacuum pump, and other associated chamber and/or processing functions. The controller executes system control software stored in a memory 38, which in the preferred embodiment is a hard disk drive, and can include analog and digital input/output boards, interface boards, and stepper motor controller boards. Optical and/or magnetic sensors are generally used to move and determine the position of movable mechanical assemblies. An example of such a CVD process chamber is described in U.S. Pat. No. 5,000,113, which is incorporated herein by reference and entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention.

The above CVD system description is mainly for illustrative purposes, and other plasma equipment, such as electrode cyclotron resonance (ECR) plasma CVD devices, induction-coupled RF high density plasma CVD devices, or the like may be employed. Additionally, variations of the above described system are possible, such as variations in substrate support design, heater design, location of RF power connections, electrode configurations, and other aspects. For example, the substrate could be supported and heated by a resistively heated substrate support.

A process regime using a He plasma is provided in Table 1 and a process regime using $N_2O$ is provided in Table 2. The gases are representative and other gases such as other inert gases or other oxygen-containing gases may be used.

TABLE 1

FOR He PLASMA

| Parameter | Range | Preferred | More Preferred |
|---|---|---|---|
| He (sccm) | 100–4000 | 500–2500 | 750–2000 |
| Press. (Torr) | 1–12 | 2–10 | 4–9 |
| RF Power (W) | 50–800 | 100–500 | 100–400 |
| RF Power density (W/in$^2$) | 0.7–11 | 1.4–7.2 | 1.4–5.7 |
| Temp. (° C.) | 0–500 | 50–450 | 100–400 |
| Spacing (Mills) | 200–700 | 300–600 | 300–500 |

TABLE 2

FOR $N_2O$ PLASMA

| Parameter | Range | Preferred | More Preferred |
|---|---|---|---|
| $N_2O$ (sccm) | 100–4000 | 500–2500 | 750–2000 |
| Press. (Torr) | 1–12 | 2–10 | 4–9 |
| RF Power (W) | 50–800 | 100–500 | 100–400 |
| RF Power density (W/in$^2$) | 0.7–11 | 1.4–7.2 | 1.4–5.7 |
| Temp. (° C.) | 0–500 | 50–450 | 100–400 |
| Spacing (Mills) | 200–700 | 300–600 | 300–500 |

The above process regimes can be used to treat the exposed surface of a carbon-containing layer, such as SiC, with a He or $N_2O$ plasma or other inert or oxidizing gases, according to the invention, in a CENTURA® DxZ™ CVD chamber, described above. Using the parameters of Table 1 or 2, a He or $N_2O$ gas, respectively, is flown into the chamber at a rate of about 100 to about 4000 standard cubic centimeters (sccm), more preferably about 750 to about 2000 sccm. The chamber pressure is maintained at about 1 to about 12 Torr, more preferably about 4 to about 9 Torr. A single 13.56 MHz RF power source delivers about 50 to about 800 watts (W), more preferably about 100 to about 400 W, to the chamber. A power density of about 0.7 to about 11 W/in$^2$, more preferably about 1.4 to about 5.7 W/in$^2$, is used. The RF power source may be a mixed-frequency RF power supply. The substrate surface temperature is maintained at about 0° to about 500° C., more preferably about 100° to about 400° C. The substrate is disposed about 200 to about 700 mils, more preferably about 300 to about 500 mils, from the gas plate.

The substrate is preferably exposed to the plasma for about 10 to about 40 seconds. In most instances, one treatment cycle lasting 20 seconds effectively treats the layer to increase the adhesion and/or reduce the susceptibility to oxidation. The parameters could be adjusted for other chambers, substrate layers, and other gases which assist in improving adhesion, particularly for those processes which improve adhesion without requiring additional deposition of layers.

The present invention is useful for treating a variety of materials. For instance, the materials could include primarily carbon-containing layers, such as organic polymeric materials, αC, αFC, SiCO:H, and other carbon-containing materials.

One material that has been used to advantage for multiple uses is a low k SiC disclosed in copending applications, U.S. Ser. No. 09/165,248, entitled "A Silicon Carbide Deposition For Use As A Barrier Layer And An Etch Stop", filed Oct. 1, 1998, and a continuation-in-part of U.S. Ser. No. 09/219,945, entitled "A Silicon Carbide Deposition For Use as a Low Dielectric Constant Anti-Reflective Coating", filed Dec. 23, 1998, both assigned to the assignee of the present invention, Applied Materials, Inc. and both incorporated by reference herein. This particular SiC offers the advantage of being able to function as barrier layer, etch stop, ARC, and/or passivation layer as well as have a low k value and could benefit from improved adhesion and increased oxidation resistance.

The process regimes yield a SiC material having a dielectric constant of less than 7, preferably about 5 or less, and most preferably about 4.2 or less. To deposit such a SiC layer on a 200 mm wafer, a reactive gas source such as trimethylsilane is flown into a reaction chamber, such as a CENTURA® DXZ™ chamber, without a substantial source of oxygen introduced into the reaction zone, the trimethylsilane flowing at a preferable rate of about 50 to about 200 sccm. Preferably, a noble gas, such as helium or argon, is also flown into the chamber at a rate of about 200 to about 1000 sccm. The chamber pressure is maintained preferably at about 6 to about 10 Torr. A single 13.56 MHz RF power source preferably delivers about 400 to about 600 W to the chamber, preferably about 5.7 to about 8.6 W/in$^2$. The substrate surface temperature is preferably maintained at about 300° to about 400° C. during the deposition of the SiC and the substrate is preferably located about 300 to about 500 mils from a gas showerhead.

Figure 2:
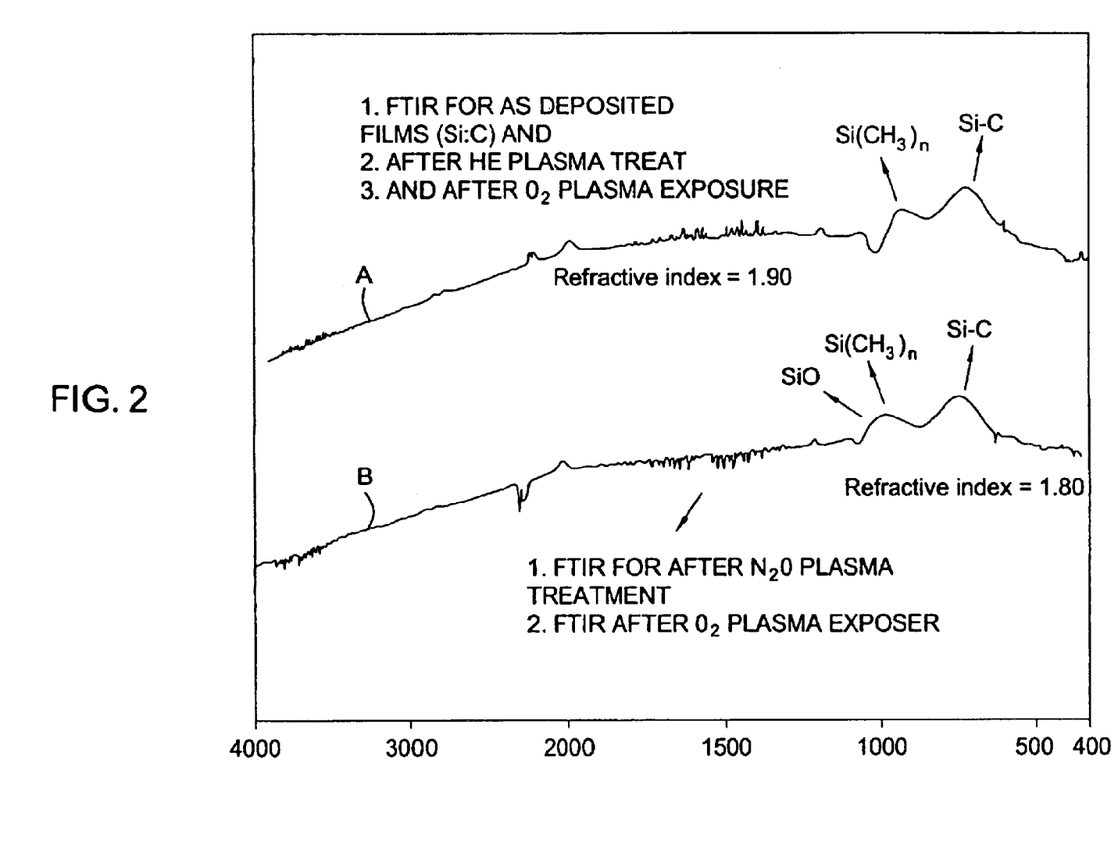
FIG. 2 is a Fourier Transform Infrared (FTIR) chart of the SiC of the present invention, indicating a particular bonding structure.

FIG. 2 is a Fourier Transform Infrared (FTIR) analysis of samples of SiC treated with a He and $N_2O$ plasma according to the present invention, showing the bonding structure of each treated SiC layer. The upper line A shows the bonding structure of a SiC layer as deposited. The portions of the analysis corresponding to different bonding structures applicable to the present invention have been identified, including the $Si(CH_3)_n$ and SiC bonds. Overlaid on the line A is the bonding structure of the specimen after the He plasma treatment. As can be seen, the He plasma exposure has minimal to no effect on the composition and detected bonding structure of the specimen. Also, overlaid on the line A is the bonding structure of the specimen after an $O_2$ plasma exposure. By conditioning the substrate with the He plasma before subjecting the substrate to the $O_2$ plasma for about 10 to about 30 minutes, the substrate showed no appreciable effect from the $O_2$ plasma exposure.

The lower line B shows the bonding structure of a SiC specimen after $N_2O$ plasma treatment. The $N_2O$ plasma treatment alters the bonding structure from the untreated specimen shown in the upper line A. The change appears largely in the Si—O bonding structure of the $N_2O$ plasma treated specimen. Overlaid on the lower line B is the bonding structure of the specimen that has been treated by the $N_2O$ plasma and then subjected to an $O_2$ plasma exposure, such as ashing, for about 10 to about 30 minutes. There appears to be no substantial difference in the bonding structure of the specimen after plasma treatment with $N_2O$ and the specimen after a subsequent $O_2$ plasma exposure.

The results confirm that the He plasma does not significantly affect the composition of the SiC layer as detected by ESCA/XPS and FTIR analyses. The He treatment produces less change to the chemical composition than the $N_2O$ plasma treatment. It is believed that the change is primarily a physical change in the surface layer bonding structure, primarily to the Si dangling bonds as a result of the He plasma exposure. The surface change due to the He plasma treatment could be less than about 5 Å to about 10 Å deep. For the $N_2O$ plasma treatment of SiC, it is believed that the oxygen from the $N_2O$ gas reacts to form a Si—O bond and/or C—O bond at the SiC surface, which reduces Si dangling bonds and improves the adhesion and oxidation resistance.

EXAMPLE 1

Tables 3 and 4 show data of an Electron Spectroscopy for Chemical Analysis/X-Ray Photoelectron Spectroscan (ESCA/XPS) analysis report for the chemical composition changes and bonding structural changes of a SiC layer deposited on a dielectric layer and exposed to a treating plasma, such as a He or $N_2O$ plasma.

A series of SiC layers was exposed to the plasma treatment according to process regimes set forth in Tables 1 and 2. A He or $N_2O$ gas was flown into a chamber at a rate of about 1500 sccm, the chamber pressure was maintained at about 8.5 Torr, and a single 13.56 MHz RF power source delivered about 250 W to the chamber for a 200 mm wafer. The substrate surface temperature was maintained at about 250° C. to about 400° C. and the substrate was disposed about 400 mils from the gas plate. The substrate was exposed to the plasma for about 20 seconds.

TABLE 3

| Sample | C | O | Si | N | F | Cl |
|---|---|---|---|---|---|---|
| Base-untreated | 56 | 8 | 36 | — | — | 0.5 |
| He Plasma | 56 | 8 | 34 | 1 | 0.5 | — |

TABLE 3-continued

| Sample | C | O | Si | N | F | Cl |
|---|---|---|---|---|---|---|
| $N_2O$ Plasma Surface | 5 | 67 | 28 | — | — | — |
| $N_2O$ Plasma Bulk | 35 | 24 | 36 | 4 | — | — |

An untreated SiC sample contained about 56% C, 8% O, 36% Si, and negligible amounts of N, F, and Cl. The SiC layer treated by the He plasma contained a similar composition. The He plasma was used without the substantial presence of other gases including oxygen, hydrogen, and/or nitrogen. To the extent that any oxygen, hydrogen, and/or nitrogen was present in the He gas plasma, the presence of such gases was negligible.

The $N_2O$ treated sample, measured at or near the surface, changed the composition of the SiC layer to about 5% C, 67% O, and 28% Si, reflecting the additional oxidation of the surface of the SiC layer. Because of the surface compositional changes due to the $N_2O$ plasma exposure, the SiC layer was also analyzed throughout the bulk of the layer cross-section having a thickness of about 3000 Å. The analysis showed a change in composition to about 35% C, 24% O, 36% Si, and 3% N.

Table 4 shows data of an ESCA/XPS analysis report, detailing the carbon content and the chemical bonding structure associated with the carbon of the samples of Table 3.

TABLE 4

| Sample | Si-C | C—C, C—H | C—O | O=C—O |
|---|---|---|---|---|
| Base | 69 | 30 | 1 | — |
| He Plasma | 68 | 29 | 3 | — |
| $N_2O$ Plasma Surface | — | 78 | 20 | 2 |
| $N_2O$ Plasma Bulk | 84 | 16 | — | — |

The results show that the bonding structure remains relatively constant with the He plasma treatment. The SiC surface composition is modified with the $N_2O$ plasma treatment to include more C—C and C—H bonds, and is believed to form Si—O and/or C—O bonds and otherwise to passivate the Si dangling bonds or other dangling bonds. The bonding changes at the surface increase the adhesion to subsequent layers. Additionally, the $N_2O$ oxidizes a thin portion of the layer by the controlled $N_2O$ exposure, creating a surface that is resistant to further and deeper oxidation compared to an untreated layer.

EXAMPLE 2

Table 5 shows the results of the plasma treatment of SiC in an ashing compatibility study. A series of specimens with SiC was treated with He or $N_2O$ plasma according to the present invention, using the preferred process parameters described in Tables 1 and 2 above. A specimen of SiC layer was left untreated as a comparison specimen and another specimen deposited an undoped silicon glass (USG) layer on the SiC layer as another comparison specimen.

For this example, a He or $N_2O$ gas was flown into a chamber at a rate of about 1500 sccm, the chamber pressure was maintained at about 8.5 Torr, and a single 13.56 MHz RF power source delivered about 250 W to the chamber for a 200 mm wafer. The substrate surface temperature was maintained at about 350° C. to about 450° C. and the substrate was disposed about 400 mils from the gas plate. The substrate was exposed to the plasma for about 20 seconds. Thickness measurements were taken before and after an ashing process which used an oxygen plasma to remove a photoresist layer. As can be seen, the results show that the He and $N_2O$ plasma treatments reduce or prevent further oxidation in air or other oxidizing environments such as ashing.

TABLE 5

| Sample SiC | Thickness Before Ashing in Å | | | Thickness After Ashing in Å | | |
|---|---|---|---|---|---|---|
| | Oxide Layer | SiC Layer | Total | Oxide Layer | SiC Layer | Total |
| Base untreated layer | 40 | 2895 | 2935 | 191 | 2874 | 3065 |
| He Plasma | 0 | 3108 | 3108 | 60 | 3008 | 3068 |
| $N_2O$ Plasma | 210 | 2821 | 3031 | 255 | 2673 | 2928 |
| Base with USG layer deposited thereon | 242 | 2978 | 3220 | 256 | 3064 | 3320 |

The distinctions between the untreated SiC and the plasma treated SiC can be seen by comparing the differences in approximate oxide layer thicknesses shown in Table 5. A large increase in the layer thickness from oxidation can affect the characteristics of the overall layer, by increasing the dielectric constant or decreasing the ability of a barrier layer to resist metal diffusion. Thus, it is desirable to minimize any increase in the oxidized layer thickness. The oxide layer thickness of the untreated SiC layer was about 40 Å before ashing and about 191 Å after ashing, an increase of about 150 Å. In contrast, the oxide layer thickness of the SiC layer treated with He plasma was about 0 Å before ashing and about 60 Å after ashing, an increase of only about 60 Å. The SiC treated with the $N_2O$ plasma has an initial oxide layer thickness of about 210 Å and a resulting oxide layer thickness of about 255 Å after the ashing process, an increase of only about 45 Å. As a comparison to the plasma treated SiC layers, about 240 Å of USG was deposited over a SiC layer and then exposed to an ashing process. The thickness before ashing was about 242 Å and after ashing was 256 Å, an increase of about 14 Å.

The test results show that the treated SiC layers resist oxidation from ashing about 300% more than the untreated SiC layer. The results also show that the treated SiC layers result in an oxidation that is only about 30 Å to about 45 Å more than an underlying SiC layer with a USG layer deposited thereon.

EXAMPLE 3

A series of SiC layers was exposed to the $N_2O$ plasma treatment according to process regimes set forth in Table 2. Specifically, for this example, about 1500 sccm of $N_2O$ gas was flown into the chamber, the chamber pressure was maintained at about 8.5 Torr, a RF power of about 250 W was delivered to the chamber with a substrate temperature of about 350° C. to about 400° C. and a substrate to gas plate spacing of about 400 mils. In this test, the substrate layers included a 5000–20000 Å thick layer of USG, a 200–1000 Å thick layer of SiC, followed by another USG oxide layer deposited thereon, and then capped with a 500 Å layer of nitride material. The SiC layer was treated with the plasma of the present invention prior to deposition of the USG layer. In one set of tests, specimens having a SiC layer were treated with an $N_2O$ plasma for about 20 seconds. On one set of specimens, a 7000 Å layer of USG material was deposited thereon and on another set, a 10000 Å layer of USG material was deposited thereon, each thickness representing typical deposited thicknesses in commercial embodiments. Similar specimens were prepared with similar USG thicknesses deposited thereon with the SiC layer being treated for about 30 seconds instead of 20 seconds. Each set was examined for delamination under an optical microscope after about 1 hour, 2 hours, 3 hours, and 4 hours of annealing. Even with an annealing temperature of 450° C., the specimens showed no delamination.

A similar series of tests were conducted on similar SiC layers with USG layers deposited thereon for similar time periods of treatment, but using a He plasma treatment process according to the parameters of Table 1. Specifically, for this example, about 1500 sccm of He gas was flown into the chamber, the chamber pressure was maintained at about 8.5 Torr, a RF power of about 250 W was delivered to the chamber with a substrate temperature of about 350° C. to about 400° C. and a substrate to gas plate spacing of about 400 mils. The He plasma treatment yielded similar results as the $N_2O$ plasma treatment.

EXAMPLE 4

A series of SiC layers was exposed to the $N_2O$ plasma treatment according to process regimes set forth in Table 2. Specifically, for this example, about 1500 sccm of $N_2O$ gas was flown into the chamber, the chamber pressure was maintained at about 8.5 Torr, a RF power of about 250 W was delivered to the chamber with a substrate temperature of about 350° C. to about 400° C. and a substrate to gas plate spacing of about 400 mils. In this test, the substrate layers included a 5000–20000 Å thick layer of USG, a 200–1000 Å thick layer of SiC, followed by another USG layer deposited thereon, and then capped with a 500 Å layer of nitride material. The SiC layer was treated with the plasma of the present invention prior to deposition of the USG layer. In one set of tests, specimens having a SiC layer were treated with an $N_2O$ plasma for about 20 seconds. On one set of specimens, a 7000 Å layer of USG material was deposited thereon and on another set, a 10000 Å layer of USG material was deposited thereon, each thickness representing typical deposited thicknesses in commercial embodiments. Similar specimens were prepared with similar USG thicknesses deposited thereon with the SiC layer being treated for about 30 seconds instead of 20 seconds. Each set was examined for delamination under an optical microscope after about 1 hour, 2 hours, 3 hours, and 4 hours of annealing. Even with an annealing temperature of 450° C., the specimens showed no delamination.

The layer adhesion of the stack was then tested by a "stud pull test" wherein a stud is affixed typically by an epoxy adhesive to the stack and then pulled in a tensile direction and the tensile force measured until either the stud or the epoxy adhesive detaches from the substrate or the layers separate from the remaining substrate layers. Even with an annealing temperature of 450° C. for several cycles, the specimens did not delaminate prior to the stud separating from the substrate. The $N_2O$ plasma treatment of the SiC for 20 seconds required greater than about 11000 pounds per square inch (psi) to lift or separate the subsequent layer from the SiC, where the stud pulled loose from the epoxy at about 11000 psi without any delamination of the layers.

A similar set of tests was conducted on SiC specimens using the He plasma treatment parameters of Table 1. Specifically, for this example about 1500 sccm of He gas was flown into the chamber, the chamber pressure was maintained at about 8.5 Torr, a RF power of about 250 W was delivered to the chamber with a substrate temperature of about 350° C. to about 400° C. and a substrate to gas plate spacing of about 400 mils. Similar thicknesses of the layers and a similar exposure time as the $N_2O$ plasma treatment described above were used for the He plasma treatment.

The He plasma treatment required greater than about 7900 psi to lift the subsequent layer from the SiC, where the stud pulled loose from the epoxy at about 7900 psi. Commercially, a value of about 4000 psi is acceptable. By comparison, similar stacks will typically fail a stud pull test generally at less than about 1000 psi and delaminate without the treatment of the present invention. The He plasma is preferred and is sufficient for most commercial processing of substrates, particularly because of the similarity in chemistry between the SiC deposition and the He plasma treatment.

Figure 3:
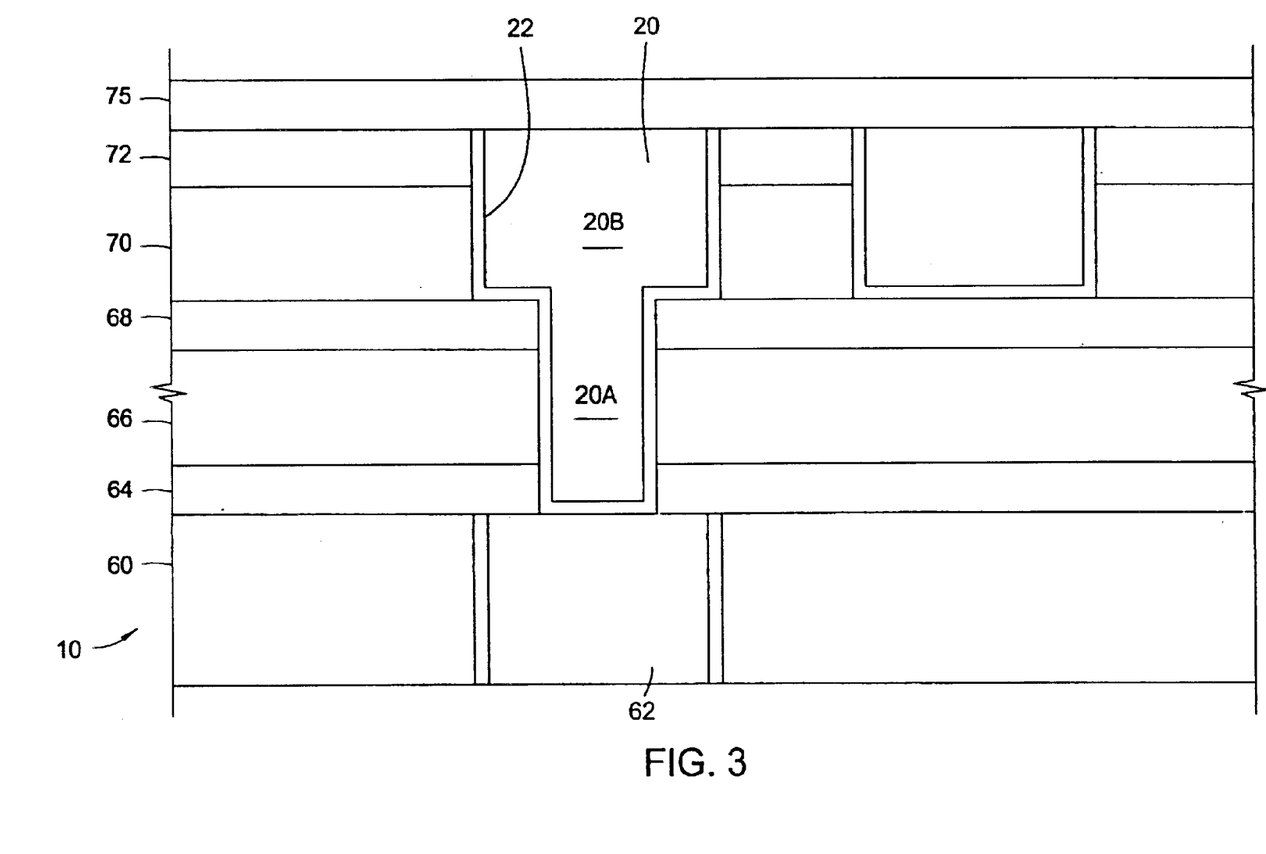
FIG. 3 shows a preferred embodiment of a dual damascene structure, utilizing the present invention.

The present invention can be used on a variety of structures, including damascene structures and can be used on a variety of layers within the structure. FIG. 3 shows a schematic of one exemplary damascene structure, which in a preferred embodiment includes several layers of SiC as a barrier layer, etch stop, ARC, and/or other layers where each layer may be exposed to the plasma treatment of the present invention. Furthermore, the structure preferably includes an in situ deposition of two or more of the various layers in the stack. The dielectric layers can be deposited with the same or similar precursors as the SiC material or can be deposited with different precursors. For the metallic layers, such as copper deposited in features, the embodiment also preferably utilizes a plasma containing a reducing agent, such as ammonia, to reduce any oxides that may occur on the metallic surfaces.

At least two schemes can be used to develop a dual damascene structure, where lines/trenches are filled concurrently with vias/contacts. In a "counterbore" scheme, the integrated circuits are typically formed by depositing a barrier layer, first dielectric layer, etch stop, second dielectric layer, ARC, and photoresist where the substrate is then etched. In FIG. 3, the integrated circuit 10 includes an underlying substrate 60, which may include a series of layers deposited thereon and in which a feature 62 has been formed. If a conductor is deposited over the feature 62, such as copper, the conductor may oxidize. In situ with the deposition of the various layers, the oxide on the conductor can be exposed to a plasma containing a reducing agent of nitrogen and hydrogen, such as ammonia, to reduce the oxide. One embodiment is described in co-pending U.S. Ser. No. 09/193,920, incorporated herein by reference, which describes plasma process parameters using an ammonia flow rate of about 100 to about 1000 sccm with a chamber pressure range of about 1 to about 9 Torr, an RF power of about 100 to about 1000 watts for a 200 mm wafer, and a substrate to gas plate spacing of about 200 to about 600 mils.

The SiC can be deposited in situ as a barrier layer, an etch stop, an ARC, and/or passivation layer with the dielectric layers. For each SiC layer, the plasma treatment of the present invention may be utilized. For instance, a SiC barrier layer 64, preferably about 500 Å thick, is deposited over the substrate and feature. Without the necessity of removing the substrate, a dielectric layer 66 may be in situ deposited over the barrier layer 64, preferably about 5000 Å thick. Preferably, the dielectric layer is an oxide based dielectric material having low k characteristics. The dielectric layer may be un-doped silicon dioxide also known as un-doped silicon glass (USG), fluorine-doped silicon glass (FSG), or other silicon-carbon-oxygen based materials, some of which can be low k materials. A low k etch stop 68, also of SiC material according to the present invention, is then in situ deposited on the dielectric layer 66 to a thickness of about 200 Å to about 1000 Å, preferably about 500 Å. The etch stop material is typically a material that has a slower etching rate compared to the dielectric layer that is etched and allows some flexibility in the etching process to ensure that a predetermined depth is reached. In some well characterized etching processes, the etch stop may be unnecessary. Another dielectric layer 70 is deposited over etch stop 68, having a thickness from about 5,000 Å to about 10,000 Å, preferably about 7000 Å. Dielectric layer 70 can be the same material as dielectric layer 66. Likewise, the dielectric layer 70 can be deposited in situ with the barrier layer 64, dielectric layer 66, and etch stop 68. An ARC 72, also of SiC material and preferably about 600 Å thick, is deposited on the dielectric layer 70, using the same or similar chemistry as the underlying etch stop and barrier layer. After the ARC deposition, a photoresist layer (not shown) is deposited on the ARC 72. Depositing and exposing of the photoresist and etching would normally be accomplished in other chambers. The photoresist layer is exposed to form a pattern for the via/contact 20a, using conventional photolithography. The layers are then etched using conventional etch processes, typically using fluorine, carbon, and oxygen ions to form the via/contact 20a. The photoresist layer is subsequently removed. Another photoresist layer is deposited and exposed to pattern the features, such a line/trench 20b and the layer(s) are etched to form the line/trench 20b. The photoresist layer is subsequently removed. A liner 22 may be needed over the features or on the fields between the features, which typically is Ta, TaN, Ti, TiN, and other materials. A conductive material 20, such as copper or aluminum, is then deposited simultaneously in both the via/contact 20a and the line/trench 20b. Once the conductive material 20 is deposited over the feature(s), it too may be exposed to a plasma containing a reducing agent, such as ammonia, to reduce any oxides. Another SiC barrier layer 75 may be deposited over the conductive material 20 to help prevent diffusion of the conductor through subsequent layers.

Another scheme for creating a dual damascene structure is known as a "self-aligning contact" (SAC) scheme. The SAC scheme is similar to the counterbore scheme, except that a photoresist layer is deposited over the etch stop, the etch stop is etched and the photoresist is removed. Then the subsequent layers, such as another dielectric layer, are deposited over the patterned etch stop, an ARC deposited over the dielectric layer, and a second photoresist layer deposited over the ARC, where the stack is again etched. In the embodiment of FIG. 3, for instance, a photoresist layer (not shown) is deposited over the etch stop 68, in typically a separate chamber from the etch stop deposition. The etch stop 68 is etched to form a pattern for a via/contact 20a. The photoresist layer is removed. The dielectric layer 70 and ARC 72 can then be in situ deposited in the same chamber as the etch stop was deposited. Another photoresist layer is deposited on the ARC 72. The photoresist is then exposed to form the pattern for the line/trench 20b. The line/trench 20b and the via/contact 20a are then etched simultaneously. The photoresist layer is subsequently removed. Conductive material 20, and if desired, another barrier layer 75, are deposited over the substrate.

The in situ processing is enhanced because of the reduced number of different materials and regimes and, in particular, because the SiC can be used as the barrier layer, etch stop, ARC layer, and even as a passivation layer and moisture barrier. The in situ processing is further enhanced in the preferred embodiment by using the same or similar precursors to deposit the dielectric layers. Reducing or eliminating the need to remove the substrate from the processing chamber between depositing the layers for chamber cleanings and the like improves throughput, reduces downtime, and reduces the risk of contamination.

In some instances, the etching may be performed in the same chamber by adjusting the process conditions. However, in many instances, the substrate may be moved to an etching chamber. In such instances, the processing may be performed within a cluster tool having both a deposition chamber and an etch chamber, such as the cluster tool shown in U.S. Pat. No. 4,951,601, assigned to the current assignee of the invention, and incorporated herein by reference. The sealable cluster tool enables processing within the cluster tool to occur without unnecessary exposure to the ambient conditions. However, where possible a preferred arrangement enables processing within same chamber to reduce the transfer time between chambers for greater throughput.

Furthermore, in situ processing provides accurate control over the rate of transition between the deposited layer and the preceding layer. The transition between the two layers is controlled by the transition between the chemistries and the related process parameters used to deposit the layers. The method of the present invention enables accurate control over the transition via control over the plasma, process gas flow rates, and other processing parameters. The transition may be abrupt and can be achieved, for example, by extinguishing the plasma followed by the deposition of the dielectric layers and the various SiC layers while the substrate remains in the chamber. Gradual transitions can also be achieved, for example, by altering the flow rates of the process gases. In a process which deposits a FSG dielectric layer, the flow rate of silicon tetrafluoride, commonly used for a FSG deposition, may be reduced while increasing the helium or argon flow to create a smooth transition from the dielectric layer to the SiC layer. The flexibility in the transition is made possible by the ability to deposit multiple layers in situ. The above discussion refers to an exemplary sequence and is not to be construed as limited to such sequence, as such in situ processing could be applied to a variety of sequences. Also, these structures are exemplary for a dual damascene structure and are not intended to be limiting of the possible embodiments.

The embodiments shown and described are not intended to limit the invention except as provided by the appended claims. Furthermore, in the embodiments, the order of the layers may be modified and thus, the term "deposited on" and the like in the description and the claims includes a layer deposited above the prior layer but not necessarily immediately adjacent the prior layer and can be higher in the stack. For instance, without limitation, various liner layers could be deposited adjacent dielectric layers, barrier layers, etch stops, metal layers, and other layers.

While foregoing is directed to the preferred embodiment of the present invention, other and further embodiments of the invention may be devised without departing from the basic scope thereof, and the scope thereof is determined by the claims that follow.

What is claimed is:

1. A method of processing a semiconductor substrate, comprising:

depositing a silicon carbide layer on a semiconductor substrate;

treating the silicon carbide layer with a plasma consisting essentially of an inert gas; and depositing a layer comprising a silicon-carbon-oxygen based material over the silicon carbide layer.

2. The method of claim 1, wherein the treating the silicon carbide layer increases the oxidation resistance of the silicon carbide layer.

3. The method of claim 1, wherein the treating the silicon carbide layer prevents delamination of the layer comprising the silicon-carbon-oxygen based material from the silicon carbide layer.

4. The method of claim 1, wherein the inert gas is He.

5. The method of claim 1, wherein the treating the silicon carbide layer comprises exposing the silicon carbide layer to the plasma generated by flowing the inert gas into a processing chamber at a rate of about 100 to about 4000 sccm, establishing a chamber pressure between about 1 to about 12 Torr, and applying RF power to an electrode of the chamber to provide a power density of about 0.7 to about 11 W/in$^2$.

6. The method of claim 1, wherein the treating the silicon carbide layer and the depositing the silicon carbide layer are performed in a single process chamber.

7. The method of claim 1, wherein the treating the silicon carbide layer does not substantially change a composition of the silicon carbide layer as detected by a fourier transform infrared analysis.

* * * * *

UNITED STATES PATENT AND TRADEMARK OFFICE
CERTIFICATE OF CORRECTION

| | |
|---|---|
| PATENT NO. | : 6,821,571 B2 |
| APPLICATION NO. | : 09/336525 |
| DATED | : November 23, 2004 |
| INVENTOR(S) | : Judy Huang |

It is certified that error appears in the above-identified patent and that said Letters Patent is hereby corrected as shown below:

On the Title Page, Item (56) References Cited,

On page 2, U.S. PATENT DOCUMENTS, first column, in between the line:

"6,004,631 A * 12/1999  Mori  427/534" and the line:

"6,528,116 B1 * 3/2003  Pokharna et al  427/255.37"

please add "6,054,206  4/2000  Mountsier  428/312.8."

Signed and Sealed this

Eighth Day of August, 2006

JON W. DUDAS
*Director of the United States Patent and Trademark Office*